(12) United States Patent
Hsu et al.

(10) Patent No.: US 7,772,830 B2
(45) Date of Patent: Aug. 10, 2010

(54) TEST HANDLER AUTOMATIC CONTACTOR CLEANER METHODS AND SURROGATE CLEANING DEVICE

(75) Inventors: Jerry Hsu, Taipei (TW); Byron Gibbs, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 315 days.

(21) Appl. No.: 11/367,957

(22) Filed: Mar. 3, 2006

(65) Prior Publication Data

US 2007/0205753 A1    Sep. 6, 2007

(51) Int. Cl.
*G01R 31/02* (2006.01)
(52) U.S. Cl. .................................. 324/158.1
(58) Field of Classification Search .................. None
See application file for complete search history.

(56) References Cited

U.S. PATENT DOCUMENTS

| | | | | |
|---|---|---|---|---|
| 5,778,485 | A | * | 7/1998 | Sano et al. ................ 15/301 |
| 5,961,728 | A | * | 10/1999 | Kiser et al. .............. 324/757 |
| 6,019,663 | A | * | 2/2000 | Angell et al. ................ 451/5 |
| 6,118,290 | A | * | 9/2000 | Sugiyama et al. ......... 324/754 |
| 6,130,104 | A | * | 10/2000 | Yamasaka ................ 324/754 |
| 6,254,469 | B1 | * | 7/2001 | Angell et al. ............ 451/527 |
| 6,257,958 | B1 | * | 7/2001 | Angell et al. ................ 451/9 |
| 6,623,345 | B2 | * | 9/2003 | Angell et al. ............ 451/527 |
| 6,777,966 | B1 | * | 8/2004 | Humphrey et al. ....... 324/757 |
| 7,202,683 | B2 | * | 4/2007 | Humphrey et al. ....... 324/757 |
| 7,474,089 | B2 | * | 1/2009 | Gibbs et al. ............ 324/158.1 |
| 2002/0019196 | A1 | * | 2/2002 | Angell et al. ................ 451/9 |
| 2003/0200989 | A1 | * | 10/2003 | Humphrey et al. ........... 134/2 |
| 2006/0001438 | A1 | * | 1/2006 | Humphrey et al. ....... 324/754 |
| 2008/0000499 | A1 | * | 1/2008 | McFarlane et al. .......... 134/18 |

* cited by examiner

*Primary Examiner*—Jermele M Hollington
(74) *Attorney, Agent, or Firm*—Yingsheng Tung; Wade J. Brady, III; Frederick J. Telecky, Jr.

(57) ABSTRACT

Methods and devices are disclosed for cleaning contactors equipped with contact pins such as pogo pins include steps which may be performed in concert with common semiconductor device testing processes using automatic test equipment and associated handlers. The preferred embodiments of the invention include method steps for mounting a surrogate cleaning device in a tester load board socket and applying the contact pins associated with automatic test equipment to the surrogate cleaning device for cleaning.

13 Claims, 2 Drawing Sheets

TEST HANDLER AUTOMATIC CONTACTOR CLEANER METHODS AND SURROGATE CLEANING DEVICE

TECHNICAL FIELD

The invention relates to electronic semiconductor devices and to processes for their manufacturing and testing. More particularly, the invention relates to methods for cleaning test interfaces and to devices which may be used in the implementation of the same.

BACKGROUND OF THE INVENTION

Semiconductor devices such as ball grid array (BGA) packaged ICs are inevitably subject to a testing process prior to their final completion or incorporation into electronic apparatus. The testing process includes but is not limited to, testing of singulated devices either bare die, packaged IC (temporary or permanent), or variants in between. Commonly, electrical testing is accomplished by means of automatic test equipment (ATE) configured for stimulating semiconductor devices and then examining their output for proper functioning. In general, contact pins associated with the ATE are placed in physical and electrical contact with metallized contact surfaces of a device under test (DUT). These surfaces may include test pads, bond pads, solder balls, and/or other conductive media. The functioning of DUTs may be tested by invoking stimuli on various inputs and then measuring responses on outputs at the metallized contact surfaces.

Generally, a tester load board formed from a printed circuit board (PCB) or other media, provides interface between an ATE and DUTs. The tester load board conventionally includes one or more contactor assembly, sometimes referred to as "test socket(s)" into which DUT(s) is (are) inserted. During automated testing, a DUT, such as a BGA for example, is thrust into the socket by the handler and held into position for the duration of testing. While held in the socket, contact surfaces on the DUT, such as solder balls in the case of a BGA, make contact with the contactor pins. After insertion into the contactor, the DUT is electrically connected to the ATE through the tester load board, its sub assemblies, and other interfacing apparatus. FIG. 1 (prior art) will be familiar to those reasonably skilled in the arts. For the purposes illustrating a context in which the invention may be used, FIG. 1 (prior art) represents a simplified schematic example of a DUT 10 brought into contact with pogo pins 12 carried by a contactor body 14 and coupled by a tester load board 16 to an ATE 18. The ATE 18 is generally supplied with numerous stored instructions governing the actual testing procedures according to the requirements of the particular type of DUT.

This type of testing presents technical challenges in order to adequately verify the operation of the DUTs while avoiding false readings which result in the erroneous rejection of operable DUTs. One of the challenges encountered in this type of testing is ensuring adequate electrical contact between the contact pins associated with the contactor, and the contact surfaces of the DUT. Poor electrical contact, often due to the presence of contaminants, can result in erroneous test readings. These readings can be indicative of IC failure modes to include continuity, functional, parametric or others common to semiconductor testing. Such erroneous readings can lead to the false rejection of otherwise good DUTs resulting in yield loss. Some yield recovery may be possible through retesting. By either accepting the erroneous yield loss or by retesting to achieve recovery, production costs are elevated.

Typically, a test "lot" includes numerous devices tested serially or in parallel which are subjected to the same testing process. A device handler thrusts each DUT into a socket where it is held in position, tested, removed, and then either rejected or accepted based on the results obtained by the ATE. Over the course of lot testing, debris may accumulate and contaminate the contact pins. This debris may originate from the testing and handling process itself, or may include manufacturing residue from the fabrication and/or assembly process(es) or from other sources. In addition to the presence of contaminants, repeatedly forcing electrical current through the necessarily small contact pins can degrade the conductivity characteristics of their contact surfaces, reducing their capacity to make secure contact. As contaminants accumulate coupled with degradation of contact surfaces, contact resistance (CRES) rises, thereby reducing the reliability of the tests. This rise in CRES may impact yield and/or test time as yield recovery testing increases. Ultimately manufacturing cost will tend to escalate.

Attempts to address the problem of fouled testing apparatus known in the arts include manually cleaning the contactor and its contact pins. Such approaches typically include some combination of brushing, blowing, rinsing, and sweeping the contact pins and/or contactor bodies. A major drawback common to these prior art techniques is the requirement that the testing be interrupted so that the tester load board with contactor assembly can be removed from the test cell. After cleaning, the tester load board with the contactor assembly must be reinstalled on the test cell and the test environment reestablished so that testing may resume. In some cases, the contact pins themselves are removed from the contactor body, cleaned, and replaced as well. Due to these and other problems, it would be useful and advantageous to provide apparatus and methods for testing semiconductor devices using improved cleaning techniques that ensure adequate electrical contact between test equipment and DUTs while avoiding the detachment of the tester load board and/or its subcomponents from the test cell, thereby reducing interruptions of the testing process.

SUMMARY OF THE INVENTION

In carrying out the principles of the present invention, in accordance with preferred embodiments thereof, methods for cleaning contactor's pins such as pogos, fuzz buttons, and the like include steps which may be performed in concert with common semiconductor device testing processes using automatic test equipment and associated handlers. The steps include thrusting a surrogate cleaning device (SCD) into the tester board's contactor assembly and by doing so, bringing the contactor's pins and the SCD's cleaning media into contact. The properties of the cleaning media, coupled with insertion and extraction, remove contaminants.

According to one aspect of the invention, in a preferred embodiment thereof, a surrogate cleaning device for use in a semiconductor device testing process includes a body approximating the DUT configuration and a cleaning media configured to align with the contact pins of the tester load board's contactor assembly.

According to other aspects of the invention, preferred embodiments include a surrogate cleaning device and methods for its use particularly adapted to cleaning of contact pins.

According to yet another aspect of the invention, the surrogate cleaning device includes cleaning media selected for its debris-capturing properties.

According to still another aspect of the invention, the surrogate cleaning device includes cleaning media selected for its abrasive properties.

The invention has advantages including but not limited to one or more of the following: improving contact between the contact pins of a tester and the contact surfaces of a DUT; reducing CRES at the contact points in an automated testing environment; and/or facilitating contactor cleaning with reduced interruption of the testing process. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

In general, the invention provides methods for cleaning a tester contactor and its associated pins with a surrogate cleaning device applied in a manner similar to that used for performing the handling of a DUT for actual testing. A preferred embodiment of a surrogate cleaning device may be used in the implementation of the method.

Figure 1:
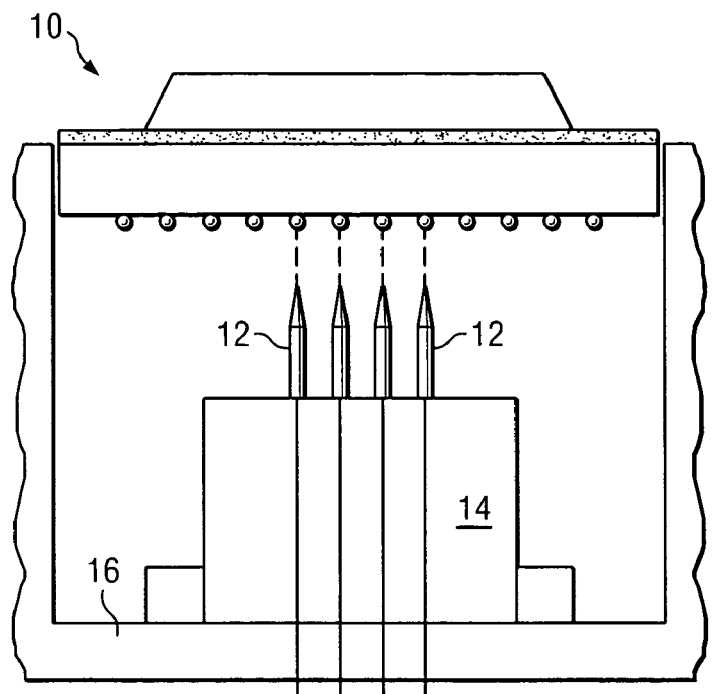
FIG. 1 (prior art) represents an example of a DUT and ATE interface demonstrating a commonly known context for potential use of the invention.
Figure 2A:
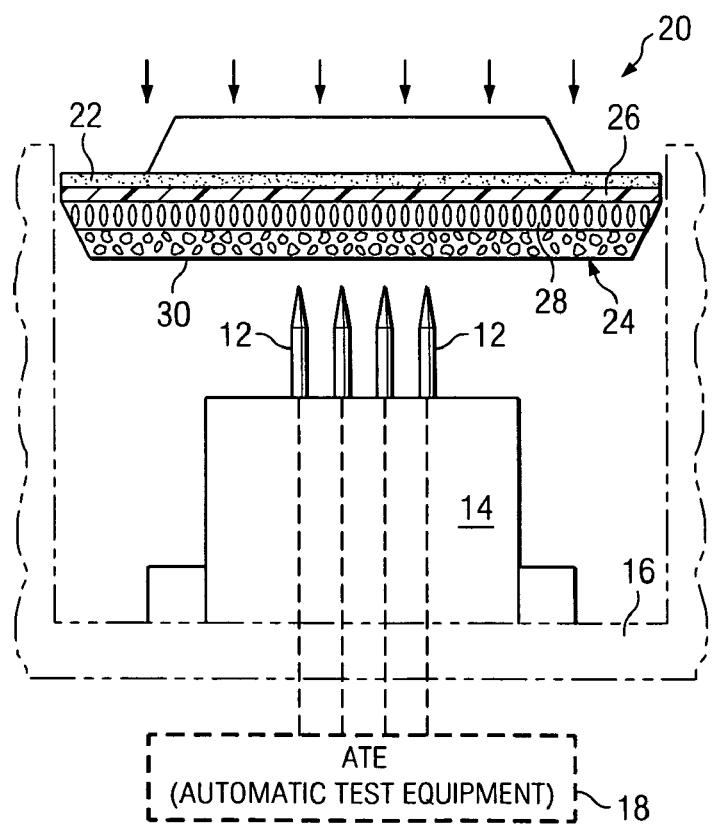
FIG. 2A is a side view of an example of preferred embodiments of a surrogate cleaning device and steps in its use in implementing methods according to the invention.
Figure 2B:
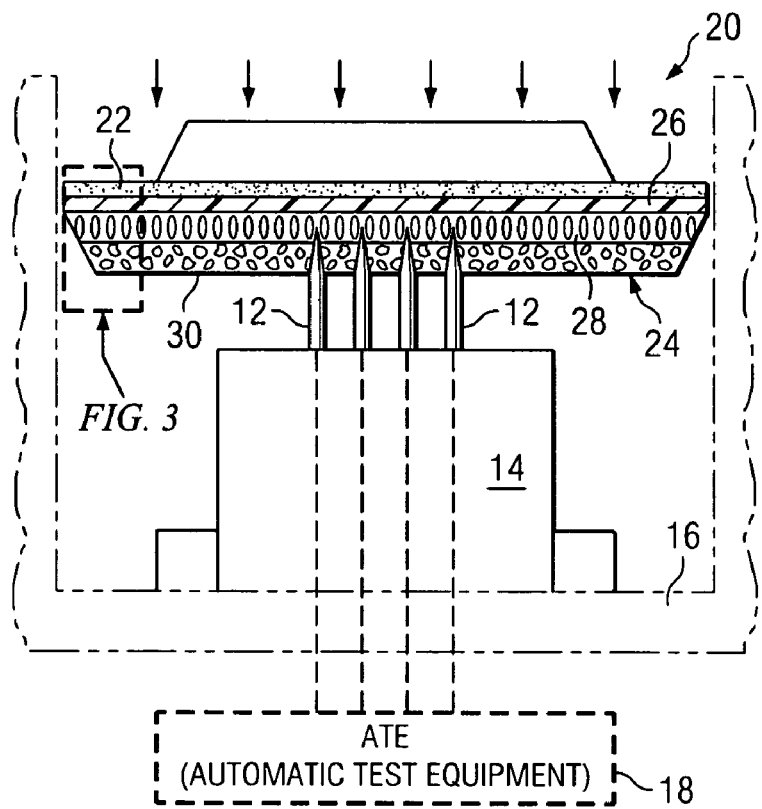
FIG. 2B is a side view of an example of preferred embodiments of a surrogate cleaning device and further steps in its use in implementing methods according to the invention.

Referring primarily to FIGS. 2A and 2B, preferred embodiments of the automatic contactor cleaning methods and apparatus of the invention are illustrated. A surrogate cleaning device 20 is placed in the tester board 16 socket, preferably by an automated handler (not shown), so that the contact pins, in this case pogo pins 12, may be brought into contact with the surrogate cleaning device 20. The surrogate cleaning device (SCD) 20 includes a rigid body 22, preferably manufactured to approximate the external dimensions of the particular type of DUT for which the tester load board 16 is configured. The SCD body 22 may include metallic, plastic, or other layers of rigid materials. As indicated by the arrows at the top of FIG. 2A, the handler may preferably be used to apply a pressing force on the surrogate cleaning device 20 body 22 in the direction of the contactor 14. The surrogate cleaning device 20 includes a surface containing cleaning media 24. The cleaning media 24 is preferably configured to bear on the pogo pins 12 and contactor body 14 when pressing force (arrow) is applied to the surrogate cleaning device 20. The cleaning media 24 is preferably made from an elastic material as further described below. Referring in particular to FIG. 2B, illustrating steps in the use of a preferred embodiment of the invention, it can be seen that the pogo pins 12 may be caused to penetrate the cleaning media 24 of the SCD 20.

Figure 3:
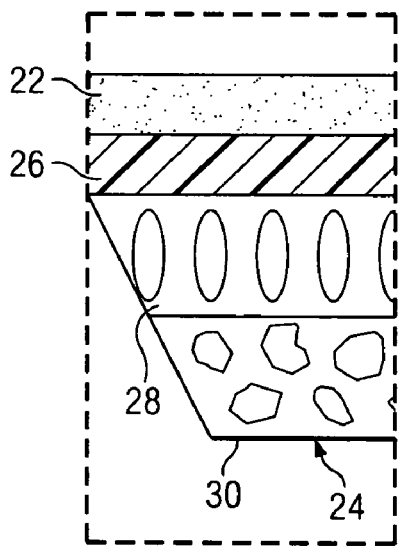
FIG. 3 is a close-up partial side view of an example of a preferred embodiment of a surrogate cleaning device of the invention.

Depicted in close-up in FIG. 3, a preferred embodiment of the surrogate cleaning device 20 is shown. As noted elsewhere herein, the SCD 20 preferably approximates the dimensions of the DUT in a particular application. This approximation need not be exact but is preferably within such tolerances as necessary to ensure proper manipulation by the handler used for the DUT without adjustment. It should be appreciated by those skilled in the arts that sufficient clearance should be maintained to permit insertion of the SCD 20 into the tester board 16 such that contact with the contactor 14 (FIG. 2B) may be made, and that it is preferable for all of the contact pins, e.g., pogo pins 12, to come into contact with the cleaning media 24. In the presently preferred embodiment of the invention, the cleaning media 24 surface is slightly smaller in the planar dimensions than the SCD body 22 as shown, yet is sufficiently large to engage the entire upper surface of the contactor body 14 and each of its pogo pins 12. The cleaning media 24 is elastic in general texture, and preferably but not necessarily includes multiple layers. Presently, the preferred cleaning media 24 has an inner layer 26 of flexible film such as polyethylene terephthalate (PET) or similar material, affixed to the SCD body 22 using a suitable adhesive. Preferably, a poly foam layer 28 is provided for the purpose of accepting the insertion of the pogo pins 12, thereby capturing contaminants and retaining them subsequent to the withdrawal of the pogo pins 12. Additionally, it is preferred to include embedded abrasive particles 30 at the external surface of the foam layer 28 for the purpose of polishing the pogo pin 12 surfaces. Again referring to FIG. 2B, it can be seen that in using the preferred embodiment of the invention shown, the pogo pins 12 penetrate the abrasive layer 30 and at least partially through the foam layer 28. It should be understood that the exact configuration of the SCD 20 and cleaning media material 24 shown in the representative embodiments depicted herein may be departed from so long as their functions are maintained within the scope of the invention as described. In implementing the presently preferred embodiment of the invention the cleaning media material used is commercially available Mipox High-Precision Finishing Tape S110000-SWE-FWX. Mipox is a trademark registered to Nihon Micro Coating Kabushiki Kaisha Company, Japan.

Figure 4:
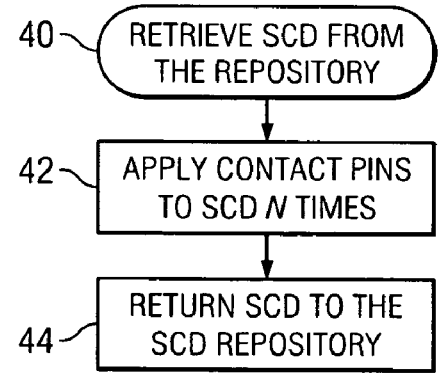
FIG. 4 is a process flow diagram of an example of a preferred method of using a surrogate cleaning device according to the invention.

A process flow diagram illustrating the methods of the invention is provided in FIG. 4, offering an alternative view of the steps for practicing methods of the invention. As shown at step 40, a surrogate cleaning device is retrieved from a repository and installed as a surrogate for a DUT, preferably by a handler according to the procedure for the test process then in use and without removal or disassembly of the contactor or tester board. Subsequently, at 42, the SCD and contact pins, in this example pogo pins, are brought into contact with one another in order to clean the pins. This step may be repeated by applying appropriate force to the SCD. The number of repetitions, denominated by "N", and/or other parameters of the cleaning technique may be optimized for a particular product line by those skilled in the arts. In the presently preferred embodiment of the invention, a range of N from about 1 to 20 is preferred. As shown at step 44, the SCD is returned to its repository following cleaning such that testing may immediately resume with a DUT. Of course, it is contemplated that the steps shown in FIG. 4 may be preceded and/or followed by testing a DUT. It should also be understood that during testing, material parameters such as the CRES of the contact pins may be monitored for performance within an acceptable threshold, or the number of devices tested may be counted, and that such monitored parameter(s), or counts, or other testing criteria, may be used to trigger the implementation of the methods of the invention.

The methods and apparatus of the invention provide one or more advantages including but not limited to reducing interruption of the testing process while maintaining clean contactors and contact pins. While the invention has been described with reference to certain illustrative embodiments, those described herein are not intended to be construed in a limiting sense. For example, variations or combinations of steps in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. In a semiconductor device testing process having automatic test equipment and associated contact pins, a method of cleaning the contact pins comprising the steps of:
   a handler placing a surrogate cleaning device into a tester load board socket and thereby applying the contact pins to cleaning media of the surrogate cleaning device;
   the handler removing the surrogate cleaning device from the tester load board socket; and
   repeating the placing and removing steps, whereby repetitive placing and removal of the surrogate cleaning device cleans the contact pins.

2. A method according to claim 1 wherein the steps are immediately preceded by the step of removing a DUT from the socket.

3. A method according to claim 1 wherein the steps are immediately followed by the step of placing a DUT into the socket.

4. A method according to claim 1 further comprising the step of dynamically triggering the placing step.

5. A method according to claim 4 wherein the dynamic triggering step further comprises counting the number of DUTs tested and triggering the placing of the surrogate cleaning device when a selected count is reached.

6. A method according to claim 4 wherein the dynamic triggering step further comprises monitoring one or more pin performance parameter and triggering the placing of the SCD when a selected threshold is reached.

7. A surrogate cleaning device for use in a semiconductor device testing process having a device handler, automatic test equipment, and associated contact pins for testing a particular DUT configuration, the surrogate cleaning device comprising:
   a body approximating the DUT configuration and suitable for manipulation by the handler; and
   a cleaning media affixed to the body and positioned for alignment with the contact pins;
   whereby the surrogate cleaning device is arranged for application of the cleaning media to the contact pins when handled by the handler in the manner of a DUT being positioned for testing.

8. A surrogate cleaning device according to claim 7 wherein the cleaning media further comprises material selected for its debris-capturing properties.

9. A surrogate cleaning device according to claim 7 wherein the cleaning media further comprises material selected for its abrasive properties.

10. A surrogate cleaning device according to claim 7 wherein the cleaning media further comprises an elastic sponge-like material.

11. A surrogate cleaning device according to claim 7 wherein the cleaning media further comprises embedded particulate material.

12. A surrogate cleaning device according to claim 7 wherein the cleaning media further comprises a flexible base layer having a foam layer affixed thereto and an abrasive layer affixed to the foam layer.

13. A surrogate cleaning device according to claim 7 wherein the cleaning media further comprises precision finishing tape.

\* \* \* \* \*